(12) United States Patent
Son

(10) Patent No.: US 9,240,409 B2
(45) Date of Patent: Jan. 19, 2016

(54) SEMICONDUCTOR DEVICE AND METHOD FOR FABRICATING THE SAME

(71) Applicant: SAMSUNG ELECTRONICS CO., LTD., Suwon-si, Gyeonggi-do (KR)

(72) Inventor: Seung-Hun Son, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/327,858

(22) Filed: Jul. 10, 2014

(65) Prior Publication Data

US 2015/0206874 A1 Jul. 23, 2015

(30) Foreign Application Priority Data

Jan. 20, 2014 (KR) .................. 10-2014-0006760

(51) Int. Cl.
*H01L 27/088* (2006.01)
*H01L 29/78* (2006.01)
*H01L 29/08* (2006.01)

(52) U.S. Cl.
CPC .......... *H01L 27/088* (2013.01); *H01L 29/0847* (2013.01); *H01L 29/7835* (2013.01)

(58) Field of Classification Search
None
See application file for complete search history.

(56) References Cited

U.S. PATENT DOCUMENTS

| | | | | |
|---|---|---|---|---|
| 5,629,220 A * | 5/1997 | Yang | ............... | 438/286 |
| 6,083,783 A * | 7/2000 | Lin et al. | ............... | 438/199 |
| 6,200,863 B1 * | 3/2001 | Xiang et al. | ............... | 438/286 |
| 6,372,587 B1 * | 4/2002 | Cheek et al. | ............... | 438/302 |
| 6,388,298 B1 * | 5/2002 | Gardner et al. | ............... | 257/408 |
| 6,396,103 B1 * | 5/2002 | Riccobene et al. | ............... | 257/335 |
| 6,833,307 B1 | 12/2004 | Wristers et al. | | |
| 7,354,839 B2 * | 4/2008 | Wei et al. | ............... | 438/305 |
| 8,017,483 B2 | 9/2011 | Freeman et al. | | |
| 2002/0109174 A1 * | 8/2002 | Pai et al. | ............... | 257/300 |
| 2003/0111683 A1 | 6/2003 | Yoshiyama | | |
| 2004/0070030 A1 * | 4/2004 | Chindalore et al. | ............... | 257/336 |

(Continued)

FOREIGN PATENT DOCUMENTS

| | | |
|---|---|---|
| JP | 2008-147693 A | 6/2008 |
| JP | 2010-225636 A | 10/2010 |
| KR | 10-2000-0061227 A | 10/2000 |

OTHER PUBLICATIONS

Yabuuchi, M.; Tsukamoto, Y.; Fujiwara, H.; Tawa, S.; Maekawa, K.; Igarashi, M.; Nii, K., "A dynamic body-biased SRAM with asymmetric halo implant MOSFETs," Low Power Electronics and Design (ISLPED) 2011 International Symposium on , pp. 285,290, Aug. 1-3, 2011.*

(Continued)

*Primary Examiner* — Joseph Schoenholtz
(74) *Attorney, Agent, or Firm* — Lee & Morse, P.C.

(57) ABSTRACT

Provided are a semiconductor device and a method for fabricating the same. The semiconductor device includes a gate structure formed on a substrate, a source/drain extension formed at one side of the gate structure while not being formed at the other side of the gate structure, and doped with a first type impurity, a halo region formed at one side of the gate structure while not being formed at the other side of the gate structure, and doped with a second type impurity different from the first type impurity, a first source/drain region formed at one side of the gate structure and doped with the first type impurity, and a second source/drain region formed at the other side of the gate structure and doped with the first type impurity.

19 Claims, 12 Drawing Sheets

(56) References Cited

U.S. PATENT DOCUMENTS

| | | |
|---|---|---|
| 2006/0040450 A1 | 2/2006 | Hsu |
| 2008/0150026 A1 | 6/2008 | Kwon et al. |
| 2009/0302388 A1* | 12/2009 | Cai et al. .................. 257/351 |
| 2010/0327374 A1 | 12/2010 | Benaissa et al. |
| 2011/0193173 A1* | 8/2011 | Nll et al. .................. 257/368 |
| 2011/0248347 A1 | 10/2011 | Benaissa et al. |
| 2012/0061761 A1 | 3/2012 | Makiyama et al. |
| 2012/0098072 A1* | 4/2012 | Han et al. .................. 257/402 |
| 2013/0026465 A1 | 1/2013 | Chang et al. |
| 2013/0049131 A1 | 2/2013 | Osada et al. |
| 2013/0178024 A1* | 7/2013 | Flachowsky et al. ......... 438/199 |
| 2013/0178035 A1* | 7/2013 | Vega .................. 438/300 |
| 2014/0042552 A1* | 2/2014 | Yoshimori et al. ............ 257/392 |
| 2014/0264558 A1* | 9/2014 | Chandra et al. ............... 257/329 |
| 2014/0357028 A1* | 12/2014 | Sassiat et al. ................ 438/217 |
| 2015/0001640 A1* | 1/2015 | Ciavatti et al. ................ 257/402 |
| 2015/0041916 A1* | 2/2015 | Yu et al. ........................ 257/392 |

OTHER PUBLICATIONS

Shauly, Eitan N. "CMOS Leakage and Power Reduction in Transistors and Circuits: Process and Layout Considerations." Journal of Low Power Electronics and Applications 2.1 (2012): 1-29.*

Nii, K.; Yabuuchi, M.; Fujiwara, H.; Tsukamoto, Y.; Maekawa, K.; Igarashi, M., "Improving SRAM read/write margin with asymmetric halo MOSFET," Semiconductor Device Research Symposium (ISDRS), 2011 International , pp. 1,2, Dec. 7-9, 2011.*

Behzad Ebrahimi, Reza Asadpour, and Ali Afzali-Kusha, "Low-Power and Robust SRAM Cells Based on Asymmetric FinFET Structures", 4th Asia Symposium on Quality Electronic Design, pp. 41 (2012).*

* cited by examiner

SEMICONDUCTOR DEVICE AND METHOD FOR FABRICATING THE SAME

CROSS-REFERENCE TO RELATED APPLICATION

Korean Patent Application No. 10-2014-0006760, filed on Jan. 20, 2014, in the Korean Intellectual Property Office, and entitled: "Semiconductor Device And Method For Fabricating The Same," is incorporated by reference herein in its entirety.

BACKGROUND

1. Field

Exemplary embodiments relate to a semiconductor device and a method for fabricating the same.

2. Description of the Related Art

As the feature size of a metal oxide semiconductor (MOS) transistor has been reduced, the length of a gate and the length of a channel formed therebelow are also gradually decreasing. As the size of the MOS transistor is reduced, power consumption of the MOS transistor is reduced. Accordingly, the density of the MOS transistor can be increased.

In addition, in order to satisfy performance of transistors requiring specific functions as well as general symmetric transistors, research into asymmetric transistors is under way.

SUMMARY

Exemplary embodiments provide a semiconductor device including an asymmetrical transistor having improved linear components in Vd-Id characteristics compared to a symmetrical transistor.

Exemplary embodiments also provide a method for fabricating a semiconductor device including an asymmetrical transistor having improved linear components in Vd-Id characteristics compared to a symmetrical transistor.

According to an aspect of exemplary embodiments, there is provided a semiconductor device comprising a gate structure formed on a substrate, a source/drain extension formed at one side of the gate structure while not being formed at the other side of the gate structure, and doped with a first type impurity, a halo region formed at one side of the gate structure while not being formed at the other side of the gate structure, and doped with a second type impurity different from the first type impurity, a first source/drain region formed at one side of the gate structure and doped with the first type impurity, and a second source/drain region formed at the other side of the gate structure and doped with the first type impurity.

A concentration of the first type impurity of the first source/drain region is a first concentration, a concentration of the first type impurity of the second source/drain region is a second concentration, a concentration of the first type impurity of the source/drain extension is a third concentration, the first concentration and the second concentration are substantially equal to each other, and the third concentration is smaller than the first concentration.

A depth ranging from a top surface of the substrate to a lowermost surface of the first source/drain region and a depth ranging from the top surface of the substrate to a lowermost surface of the second source/drain region are substantially equal to each other.

A concentration of the first type impurity of the first source/drain region is a first concentration, a concentration of the first type impurity of the second source/drain region is a second concentration, a concentration of the first type impurity of the source/drain extension is a third concentration, and the first concentration, the second concentration and the third concentration are different from one another.

The first concentration is greater than the second concentration, and the second concentration is greater than the third concentration.

The depth ranging from the top surface of the substrate to the lowermost surface of the second source/drain region is greater than the depth ranging from the top surface of the substrate to the lowermost surface of the first source/drain region.

The semiconductor device may further comprise a first recess and a second recess respectively formed at one side and the other side of the gate structure in the substrate, and the first source/drain region and the second source/drain region are formed in the first recess and the second recess, respectively.

The semiconductor device may further comprise an interlayer dielectric film formed on the substrate, the interlayer dielectric film including a trench, and the gate structure includes a gate insulation film and a gate electrode, and the gate insulation film is formed along sidewall surfaces and a bottom surface of the trench.

According to another aspect of exemplary embodiments, there is provided a semiconductor device comprising a first gate structure and a second gate structure formed on a substrate, a first source/drain extension formed at one side of the gate structure while not being formed at the other side of the gate structure, and doped with a first type impurity, a first halo region formed at one side of the first gate structure while not being formed at the other side of the first gate structure, and doped with a second type impurity different from the first type impurity, a first source/drain region formed at one side of the first gate structure and doped with the first type impurity, a second source/drain region formed at the other side of the first gate structure and doped with the first type impurity, a second source/drain extension formed at both sides of the second gate structure and doped with the first type impurity, a second halo region formed at both sides of the second gate structure and doped with the second type impurity, and a third source/drain region formed at both sides of the second gate structure and doped with the first type impurity.

A concentration of the first type impurity of the first source/drain region is a first concentration, a concentration of first type impurity of the second source/drain region is a second concentration, a concentration of the first type impurity of the third source/drain region is a third concentration, and the first concentration, the second concentration and the third concentration are substantially equal to each other.

A depth ranging from a top surface of the substrate to a lowermost surface of the first source/drain region, a depth ranging from the top surface of the substrate to a lowermost surface of the second source/drain region, and a depth ranging from the top surface of the substrate to a lowermost surface of the third source/drain region, are substantially equal to each other.

A concentration of the first type impurity of the first source/drain region is a first concentration, a concentration of first type impurity of the second source/drain region is a second concentration, a concentration of the first type impurity of the third source/drain region is a third concentration, the first concentration and the third concentration are substantially equal to each other, and the first concentration is different from the second concentration.

The first concentration is greater than the second concentration.

The depth ranging from the top surface of the substrate to the lowermost surface of the first source/drain region is substantially equal to the depth ranging from the top surface of the substrate to the lowermost surface of the third source/drain region, and the depth ranging from the top surface of the substrate to the lowermost surface of the second source/drain region is greater than the depth ranging from the top surface of the substrate to the lowermost surface of the first source/drain region.

An overlapping width between the first source/drain extension and the first gate structure is substantially equal to that between the second source/drain extension and the second gate structure.

According to still another aspect of exemplary embodiments, there is provided a semiconductor device comprising a substrate including a first region and second region, a symmetry transistor formed in the first region, the symmetry transistor including a first gate structure, a first source/drain extension and a first halo region, wherein the first source/drain extension and the first halo region are formed at both sides of the first gate structure, and an asymmetrical transistor formed on the second region, the asymmetrical transistor including a second gate structure, a second source/drain extension and a second halo region, wherein the second source/drain extension and the second halo region are formed at one side of the second gate structure and not formed at the other side of the second gate structure.

The first source/drain extension and the second source/drain extension are formed at the same level, and the first halo region and the second halo region are formed at the same level.

The symmetry transistor includes a first source/drain region formed at both sides of the first gate structure, and the asymmetrical transistor includes a second source/drain region formed at one side of the second gate structure, and a third source/drain region at the other side of the second gate structure.

The first source/drain region, the second source/drain region and the third source/drain region are formed at the same level.

The second gate structure includes gate electrode and gate spacer formed on both sidewalls of the gate electrode, and a first thickness of the gate spacer formed on one sidewall of the gate electrode is equal to a second thickness of the gate spacer formed on the other sidewall of the gate electrode.

BRIEF DESCRIPTION

The above and other features and advantages will become more apparent by describing in detail preferred embodiments thereof with reference to the attached drawings, in which.

DETAILED DESCRIPTION

Figure 1:
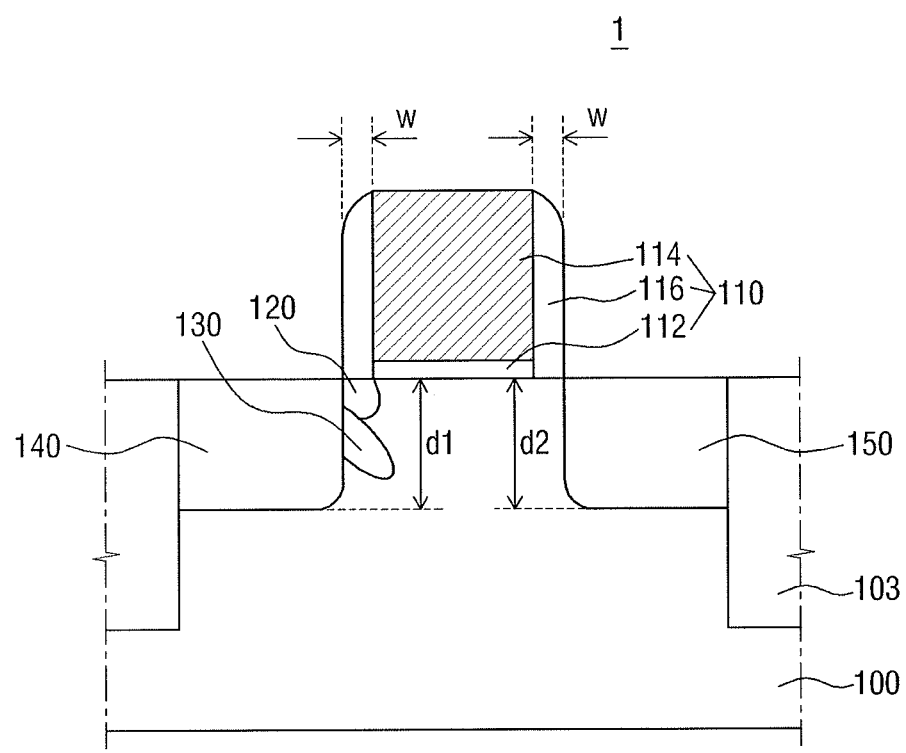
FIG. 1 illustrates a view of a semiconductor device according to a first embodiment.

Exemplary embodiments will now be described more fully hereinafter with reference to the accompanying drawings, in which preferred embodiments are shown. The exemplary embodiments may, however, be embodied in different forms and should not be construed as limited to those set forth herein. Rather, these embodiments are provided so that this disclosure will be thorough and complete, and will fully convey the scope of the exemplary implementations to those skilled in the art. The same reference numbers indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer, or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will further be understood that, although the terms first, second, etc. may be used herein to describe various elements, these elements should not be limited by these terms. These terms are only used to distinguish one element from another element. Thus, for example, a first element, a first component, or a first section discussed below could be termed a second element, a second component, or a second section without departing from the teachings of the embodiments.

The use of the terms "a", "an" and "the" and similar referents in the context of describing exemplary embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art. It is noted that the use of any and all examples, or exemplary terms provided herein, is intended merely to better describe exemplary embodiments rather than limit, unless otherwise specified. Further, unless defined otherwise, all terms defined in generally used dictionaries may not be overly interpreted.

Hereinafter, a semiconductor device according to a first embodiment will be described with reference to FIG. 1.

FIG. 1 is a view illustrating a semiconductor device according to a first embodiment.

Referring to FIG. 1, the semiconductor device 1 according to the first embodiment comprises a first gate structure 110, a first source/drain extension 120, a first halo region 130, a first source/drain region 140 and a second source/drain region 150.

The substrate 100 may be bulk silicon or a silicon-on-insulator (SOI). Alternatively, the substrate 100 may be a silicon substrate, or a substrate made of other materials selected from the group consisting of, for example, germanium, silicon germanium, indium antimonide, lead telluride compound, indium arsenide, indium phosphide, gallium arsenide, and gallium antimonide, but aspects of embodiments are not limited thereto. In the following description, it is assumed that the substrate 100 is a silicon substrate.

An isolation film 103 is formed in the substrate 100. The isolation film 103 may be a shallow trench isolation (STI) film, which is advantageous in achieving high integration because it has a good isolating characteristic and occupies a small area, but aspects of embodiments are not limited thereto.

The isolation film 103 may include, for example, at least one of silicon oxide, silicon nitride, silicon oxynitride, and a combination thereof.

The first gate structure 110 is formed on the substrate 100. The first gate structure 110 includes a first gate insulation film 112, a first gate electrode 114 and a first gate spacer 116. In the semiconductor device 1 according to the first embodiment, the first gate insulation film 112 and the first gate electrode 114 are sequentially stacked on the substrate 100 in a laminar structure. The first gate spacer 116 is formed on both sidewalls of the first gate electrode 114.

The first gate insulation film 112 may include, for example, silicon oxide, SiON, $Ge_xO_yN_z$, $Ge_xSi_yO_z$, a high-k film, a combination thereof, and a stacked film having these materials sequentially stacked one on another. The high-k film may be made of, for example, at least one selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but not limited thereto.

If the first gate insulation film 112 includes a high-k dielectric material, a barrier film may further be formed between the first gate insulation film 112 and the first gate electrode 114. The barrier film may include, for example, at least one of titanium nitride (TiN), tantalum nitride (TaN) and a combination thereof.

The first gate electrode 114 may include, for example, one of poly silicon (poly Si), amorphous silicon (a-Si), titanium (Ti), titanium nitride (TiN), tantalum nitride (TaN), aluminum (Al), and combinations thereof.

Although not shown in FIG. 1, a gate hard mask may further be formed on the first gate electrode 114. The gate hard mask may include, for example, a nitride film, an oxide film, and a combination thereof.

The first gate spacer 116 may include, for example, silicon nitride, silicon oxynitride, silicon oxide, silicon carbon nitride (SiOCN). In the illustrated embodiment, the first gate spacer 116 formed in a single layer is exemplified, but aspects of embodiments are not limited thereto. The first gate spacer 116 may be formed in multiple layers.

In the semiconductor device 1 according to the first embodiment, a thickness of the first gate spacer 116 formed on one sidewall of the first gate electrode 114 and a thickness of the first gate spacer 116 formed on the other sidewall of the first gate electrode 114 are substantially equal to each other, i.e., w. For example, the first gate spacer 116 formed on one surface of the first gate electrode 114 and the first gate spacer 116 formed on the other surface of the first gate electrode 114 may be formed by the same fabrication process.

The first source/drain extension 120 is formed at one side of the first gate structure 110 but is not formed at the other side of the first gate structure 110. That is to say, the first source/drain extension 120 is asymmetrically formed around the first gate structure 110 in the substrate 100.

A part of the first source/drain extension 120 may overlap with the first gate structure 110, for example, the first gate spacer 116.

The first source/drain extension 120 includes a doped first type impurity. For example, when a pFET is formed on the substrate 100, the first source/drain extension 120 includes a p type impurity, e.g., boron (B), and when an nFET is formed on the substrate 100, the first source/drain extension 120 includes an n type impurity, e.g., phosphorus (P), arsenic (As), or antimony (Sb).

The first halo region 130 is formed at one side of the first gate structure 110 but is not formed at the other side of the first gate structure 110. In detail, the first halo region 130 is formed only at one side of the first gate structure 110 with the first source/drain extension 120 formed thereat.

That is to say, the first halo region 130 is asymmetrically formed around the first gate structure 110 in the substrate 100.

The first halo region 130 is formed to be deeper than the first source/drain extension 120. The first halo region 130 is formed to be tilted at a predetermined angle with respect to a thickness direction of the substrate 100.

The first halo region 130 includes a doped second type impurity. The second type impurity doped into the first halo region 130 is different from the first type impurity doped into the first source/drain extension 120. For example, when a pFET is formed on the substrate 100, the first halo region 130 includes an n type impurity, e.g., phosphorus (P), arsenic (As), or antimony (Sb), and when an nFET is formed on the substrate 100, the first halo region 130 includes a p type impurity, e.g., boron (B).

The first source/drain region 140 and the second source/drain region 150 are formed at one side and the other side of the first gate structure 110, respectively. In detail, the first source/drain region 140 is formed at one side of the first gate structure 110 with the first source/drain extension 120 and the first halo region 130 formed thereat, and the second source/drain region 150 is formed at the other side of the first gate structure 110 without the first source/drain extension 120 and the first halo region 130 formed thereat.

The first source/drain region 140 and the second source/drain region 150 are formed to be deeper than the first source/drain extension 120. That is to say, lowermost surfaces of the first source/drain region 140 and the second source/drain region 150 are positioned to be deeper than a lowermost surface of the first source/drain extension 120, in view of the top surface of the substrate 100.

On the other hand, the first source/drain extension 120 is laterally closer to the first gate electrode 114 than the first source/drain region 140.

The first source/drain region 140 and the second source/drain region 150 include a doped first type impurity. In a case of a pFET, the first source/drain region 140 includes a p type impurity, and in a case of an nFET, the first source/drain region 140 includes an n type impurity. The first type impurity doped into the first source/drain region 140 and the second source/drain region 150 may be the same material with the first type impurity doped into the first source/drain extension 120, but aspects of embodiments are not limited thereto.

In FIG. 1, the first source/drain extension 120, the first halo region 130 and the first source/drain region 140 are formed at one side of the first gate structure 110 in the substrate 100. However, only the second source/drain region 150 is formed at the other side of the first gate structure 110 in the substrate 100 without a source/drain extension and a halo region formed thereat. As a result, the semiconductor device 1 according to the first embodiment includes an asymmetrical transistor.

In FIG. 1, a depth of the first source/drain region 140, that is, a depth ranging from the top surface of the substrate 100 to the lowermost surface of the first source/drain region 140, is a first depth d1. In addition, a depth of the second source/drain region 150 is a second depth d2. In the semiconductor device 1 according to the first embodiment, the depth d1 of the first source/drain region 140 is substantially equal to the depth d2 of the second source/drain region 150.

In addition, the first source/drain extension 120, the first source/drain region 140 and the second source/drain region 150 include a doped first type impurity. A concentration of the first type impurity doped into the first source/drain region 140 is a first concentration, a concentration of the first type impurity doped into the second source/drain region 150 is a second concentration, and a concentration of the first type impurity doped into the first source/drain extension 120 is a third concentration. The first concentration and the second concentration are greater than the third concentration.

In the semiconductor device 1 according to the first embodiment, the first concentration of the first type impurity doped into the first source/drain region 140 is substantially equal to the second concentration of the first type impurity doped into the second source/drain region 150.

As described above, the depth d1 of the first source/drain region 140 is substantially equal to the depth d2 of the second source/drain region 150, and the first concentration of the first type impurity doped into the first source/drain region 140 is substantially equal to the second concentration of the first type impurity doped into the second source/drain region 150.

The semiconductor device 1 according to the first embodiment includes an asymmetrical transistor having the first source/drain extension 120 and the first halo region 130 formed only at one side of the first gate structure 110, while the first source/drain region 140 and the second source/drain region 150 are symmetrically formed at both sides of the first gate structure 110 in the substrate 100.

A semiconductor device according to a second embodiment will be described with reference to FIG. 2. For convenience of explanation, the following description will focus on differences between the first and second embodiments.

Figure 2:
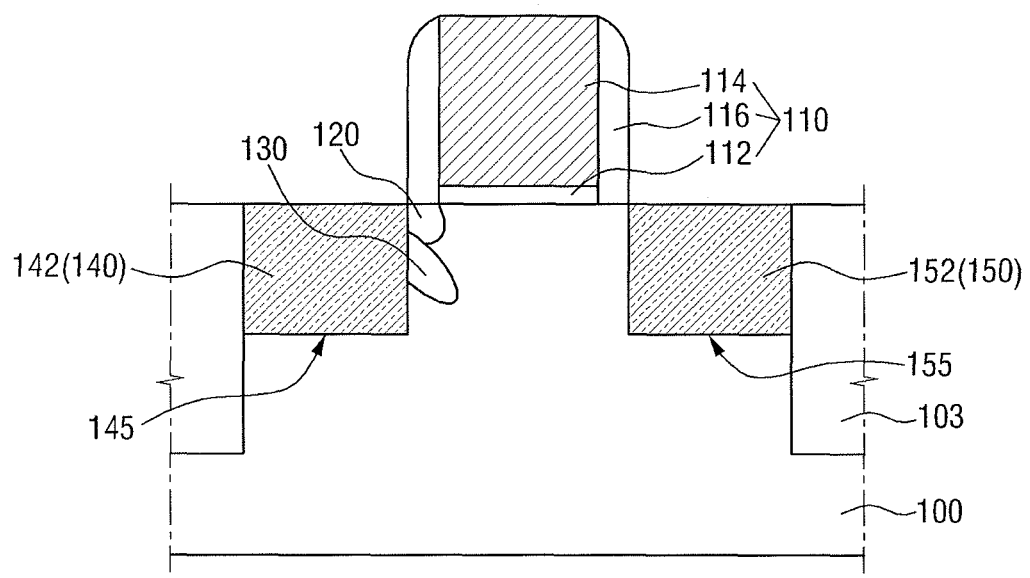
FIG. 2 illustrates a view of a semiconductor device according to a second embodiment.

FIG. 2 is a view illustrating a semiconductor device according to a second embodiment.

Referring to FIG. 2, the semiconductor device 2 according to the second embodiment further includes a first recess 145, a second recess 155, a first semiconductor pattern 142, and a second semiconductor pattern 152, as compared to the semiconductor device 1 according to the first embodiment.

The first recess 145 and the second recess 155 are formed at one side and the other side of the first gate structure 110, respectively. The first recess 145 and the second recess 155 are formed in the substrate 100. For example, the first recess 145 is formed at one side of the first gate structure 110 with the first halo region 130 and the first source/drain extension 120 formed thereat, and the second recess 155 is formed at the other side of the first gate structure 110 having the first halo region 130 and the first source/drain extension 120 not formed.

In FIG. 2, the first recess 145 and the second recess 155 having a rectangular section are exemplified, but aspects of embodiments are not limited thereto. That is to say, the first recess 145 and the second recess 155 may have sections having a sigma shape or other shapes.

The first semiconductor pattern 142 and the second semiconductor pattern 152 are formed in the first recess 145 and the second recess 155, respectively. The first semiconductor pattern 142 formed in the first recess 145 corresponds to the first source/drain region 140, and the second semiconductor pattern 152 formed in the second recess 155 corresponds to the second source/drain region 150.

The first semiconductor pattern 142 formed in the first recess 145 may be formed in contact with the first source/drain extension 120 and the first halo region 130. However, the second semiconductor pattern 152 formed in the second recess 155 may be formed in contact with only the substrate 100 without making contact with the first source/drain extension 120 and the first halo region 130.

When the semiconductor device 2 is a pFET, the first semiconductor pattern 142 and the second semiconductor pattern 152 may include compressive stress material. For example, the compressive stress material may be a material having a larger lattice constant than silicon (Si), for example, SiGe. The compressive stress material may improve the mobility of carriers of a channel region by applying compressive stress to the substrate 100 positioned under the first gate structure 110.

Conversely, when the semiconductor device 2 is an nFET, the first semiconductor pattern 142 and the second semiconductor pattern 152 may include the same material as the substrate 100 or a tensile stress material. For example, the first semiconductor pattern 142 and the second semiconductor pattern 152 may include Si or a material having a smaller lattice constant than Si (e.g., SiC).

The first semiconductor pattern 142 and the second semiconductor pattern 152 may be, for example, epitaxial layers. In addition, the first semiconductor pattern 142 and the second semiconductor pattern 152 may include a doped first type impurity.

In FIG. 2, top surfaces of the first semiconductor pattern 142 and the second semiconductor pattern 152 are coplanar with the top surface of the substrate 100, but aspects of embodiments are not limited thereto. The first semiconductor pattern 142 and the second semiconductor pattern 152 may upwardly protrude from the top surface of the substrate 100.

A semiconductor device according to a third embodiment will be described with reference to FIG. 3. For convenience of explanation, the following description will focus on differences between the first and third embodiments.

Figure 3:
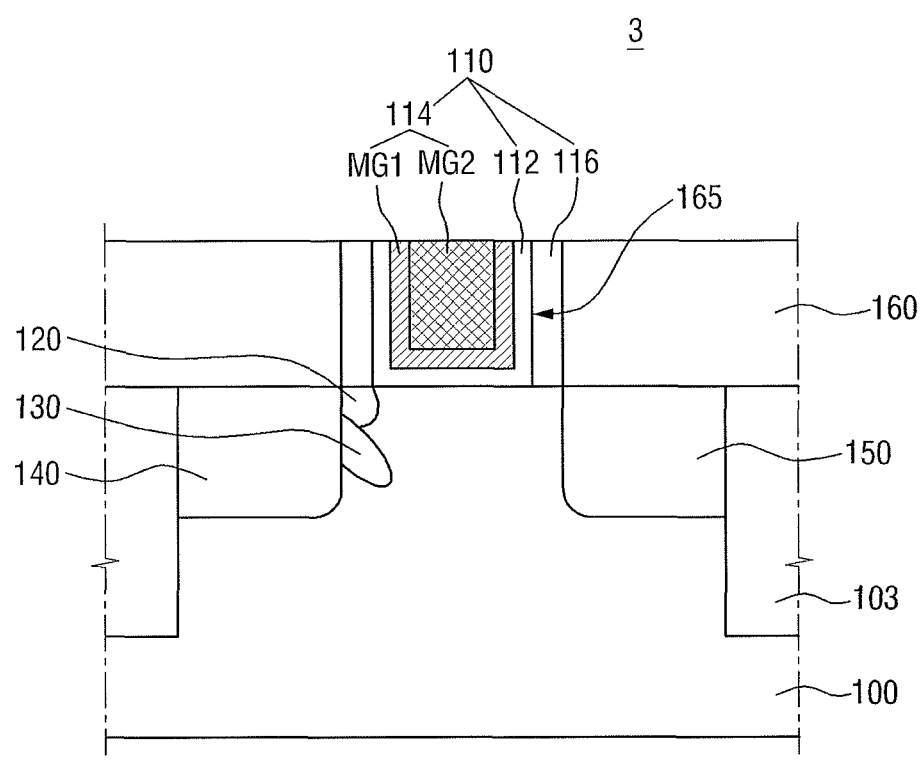
FIG. 3 illustrates a view of a semiconductor device according to a third embodiment.

FIG. 3 is a view illustrating a semiconductor device according to a third embodiment.

Referring to FIG. 3, the semiconductor device 3 according to the third embodiment further includes an interlayer dielectric film 160 including a trench 165, as compared to the semiconductor device 1 according to the first embodiment.

The interlayer dielectric film 160 includes the trench 165 exposing the top surface of the substrate 100. The trench 165 may have the first gate spacer 116 as its side surface and the top surface of the substrate 100 as its bottom surface.

The interlayer dielectric film 160 may include at least one of a low k material, oxide, nitride and oxynitride. Examples of the low k material may include flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PRTEOS), fluoride silicate glass (FSG), high density plasma (HDP), plasma enhanced oxide (PEOX), flowable CVD (FCVD), and combinations thereof, but aspects of embodiments are not limited thereto.

In the semiconductor device 3 according to the third embodiment, the first gate insulation film 112 is conformally formed along side surfaces and a bottom surface of the trench 165.

In addition, in the semiconductor device 3 according to the third embodiment, the first gate electrode 114 may be formed by filling the trench 165 having the first gate insulation film 112 formed therein using, for example, a replacement process. As shown, the first gate electrode 114 may include metal layers MG1 and MG2. As shown, the first gate electrode 114 may have two or more metal layers MG1 and MG2 stacked one on another.

The first metal layer MG1 may function to adjust a work function, and the second metal layer MG2 may function to fill a space formed by the first metal layer MG1. For example, the first metal layer MG1 may include at least one of TiN, TaN, TiC, and TaC. In addition, the second metal layer MG2 may include W or Al.

A top surface of the first gate electrode 114 including the first and second metal layers MG1 and MG2 may be coplanar with a top surface of the interlayer dielectric film 160.

A semiconductor device according to a fourth embodiment will be described with reference to FIG. 4. For convenience of explanation, the following description will focus on differences between the first and fourth embodiments.

Figure 4:
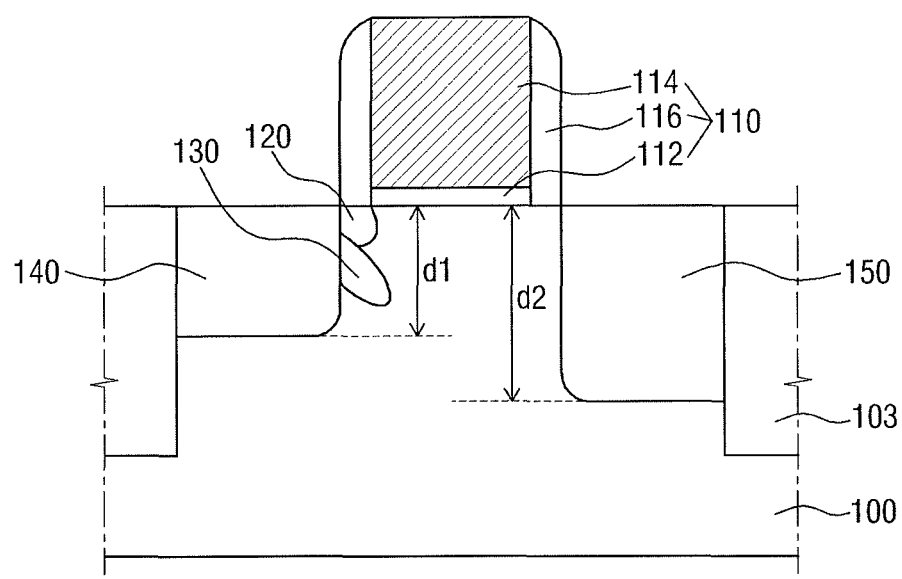
FIG. 4 illustrates a view of a semiconductor device according to a fourth embodiment.

FIG. 4 is a view illustrating a semiconductor device according to a fourth embodiment.

Referring to FIG. 4, a depth of the first source/drain region 140, that is, a depth ranging from the top surface of the substrate 100 to the lowermost surface of the first source/drain region 140, is a first depth d1. In addition, a depth of the second source/drain region 150 is a second depth d2. The depth d2 of the second source/drain region 150 is greater than the depth d1 of the first source/drain region 140.

In detail, the first source/drain region 140 formed at one side of the first gate structure 110 with the first halo region 130 and the first source/drain extension 120 formed thereat is formed to be shallower than the second source/drain region 150 formed at the other side of the first gate structure 110 without the first halo region 130 and the first source/drain extension 120 formed thereat.

In addition, a concentration of the first type impurity doped into the first source/drain region 140 is a first concentration, a concentration of the first type impurity doped into the second source/drain region 150 is a second concentration, and a concentration of the first type impurity doped into the first source/drain extension 120 is a third concentration.

The first concentration, the second concentration and the third concentration are different from one another. In detail, the third concentration of the first type impurity doped into the first source/drain extension 120 is smaller than the first concentration of the first type impurity doped into the first source/drain region 140 and the second concentration of the first type impurity doped into the second source/drain region 150.

In the semiconductor device 4 according to the fourth embodiment, the first concentration of the first type impurity doped into the first source/drain region 140 is greater than the second concentration of the first type impurity doped into the second source/drain region 150.

As a result, the second source/drain region 150 includes the first type impurity having a lower concentration than the first source/drain region 140, and is formed to be deeper than the first source/drain region 140.

The semiconductor device 4 according to the fourth embodiment includes an asymmetrical transistor having the first source/drain extension 120 and the first halo region 130 formed only at one side of the first gate structure 110. In addition, since the first source/drain region 140 and the second source/drain region 150 are formed to different depths and have different concentrations of the first type impurities included therein, the first source/drain region 140 and the second source/drain region 150 formed at both sides of the first gate structure 110 are also asymmetrically formed in the substrate 100.

A semiconductor device according to a fifth embodiment will be described with reference to FIGS. 5 and 6. For convenience of explanation, the previously described content of the above-described embodiments shown in FIGS. 1 to 3 will be only briefly described or omitted.

Figure 5:
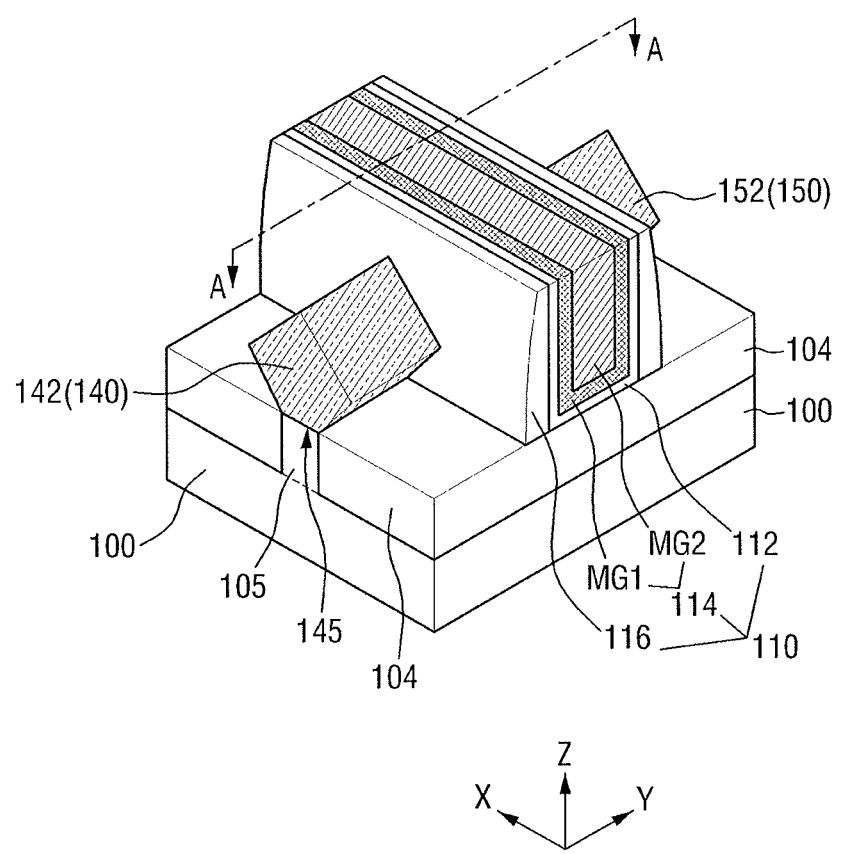
FIG. 5 illustrates a perspective view of a semiconductor device according to a fifth embodiment.
Figure 6:
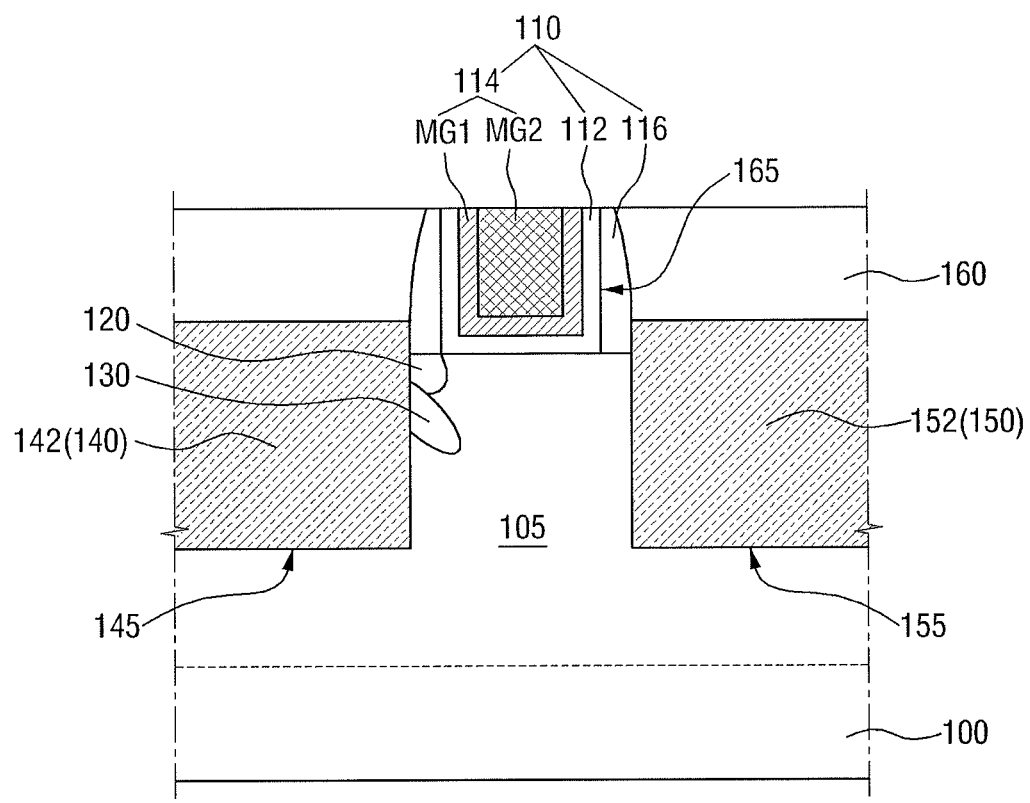
FIG. 6 illustrates a cross-sectional view taken along line A-A of FIG. 5.

FIG. 5 is a perspective view illustrating a semiconductor device according to the fifth embodiment, and FIG. 6 is a cross-sectional view taken along the line A-A of FIG. 5. For brevity, an interlayer dielectric film 160 is not illustrated in FIG. 5.

Referring to FIGS. 5 and 6, the semiconductor device 5 according to the fifth embodiment further includes a fin type active pattern 105.

The fin type active pattern 105 may protrude from the substrate 100. A field insulation film 104 covers a portion of a side surface of the fin type active pattern 105, so that the fin type active pattern 105 may upwardly protrude on the field insulation film 104 formed on the substrate 100.

The fin type active pattern 105 may extend lengthwise in a second direction Y. The fin type active pattern 105 may be part of the substrate 100 or may include an epitaxial layer grown from the substrate 100.

The fin type active pattern 105 may include, for example, an elemental semiconductor material, such as silicon or germanium. In addition, the fin type active pattern 105 may include a compound semiconductor, for example, a group IV-IV compound semiconductor or a group III-V compound semiconductor. In detail, the group IV-IV compound semiconductor may be, for example, a binary compound including at least two elements of carbon (C), silicon (Si), germanium (Ge), and tin (Sn), or a ternary compound or a compound doped with a IV group element. The group III-V compound semiconductor may include, for example, a binary compound, a ternary compound or a quaternary compound, prepared by combining at least one group III element of aluminum (Al), gallium (Ga) and indium (In) with at least one group V element of phosphorus (P), arsenic (As) and antimony (Sb).

In the semiconductor device 5 according to the fifth embodiment, it is assumed that the fin type active pattern 105 includes silicon (Si).

The first gate structure 110 is formed on the fin type active pattern 105 upwardly protruding on the field insulation film 104. The first gate structure 110 may extend lengthwise in a first direction X. The first gate structure 110 may cross the fin type active pattern 105.

The first gate insulation film 112 is formed along side surfaces and a bottom surface of the trench 165. The first gate insulation film 112 formed along the bottom surface of the trench 165 may be formed along a profile of the field insulation film 104 and the fin type active pattern 105.

The first source/drain extension 120 and the first halo region 130 may be formed at one side of the first gate structure 110. The first source/drain extension 120 and the first halo region 130 may be formed in the fin type active pattern 105.

The first source/drain region 140 is formed at one side of the first gate structure 110 with the first source/drain extension 120 and the first halo region 130 formed thereat. The second source/drain region 150 is formed at the other side of the first gate structure 110 without the first source/drain extension 120 and the first halo region 130 formed thereat.

The first source/drain region 140 and the second source/drain region 150 are formed in the first recess 145 and the second recess 155 formed in the fin type active pattern 105, respectively. That is to say, the first source/drain region 140 and the second source/drain region 150 are formed on the fin type active pattern 105.

The first source/drain region 140 and the second source/drain region 150 may have various shapes. For example, the first source/drain region 140 and the second source/drain region 150 may have at least one shape of a diamond, a circle and a rectangle. In FIG. 5, a diamond-like shape (or a pentagon shape or a hexagonal shape) is illustrated by way of example.

A semiconductor device according to a sixth embodiment will be described with reference to FIG. 7. For convenience of explanation, the following description will focus on differences between the first and sixth embodiments.

Figure 7:
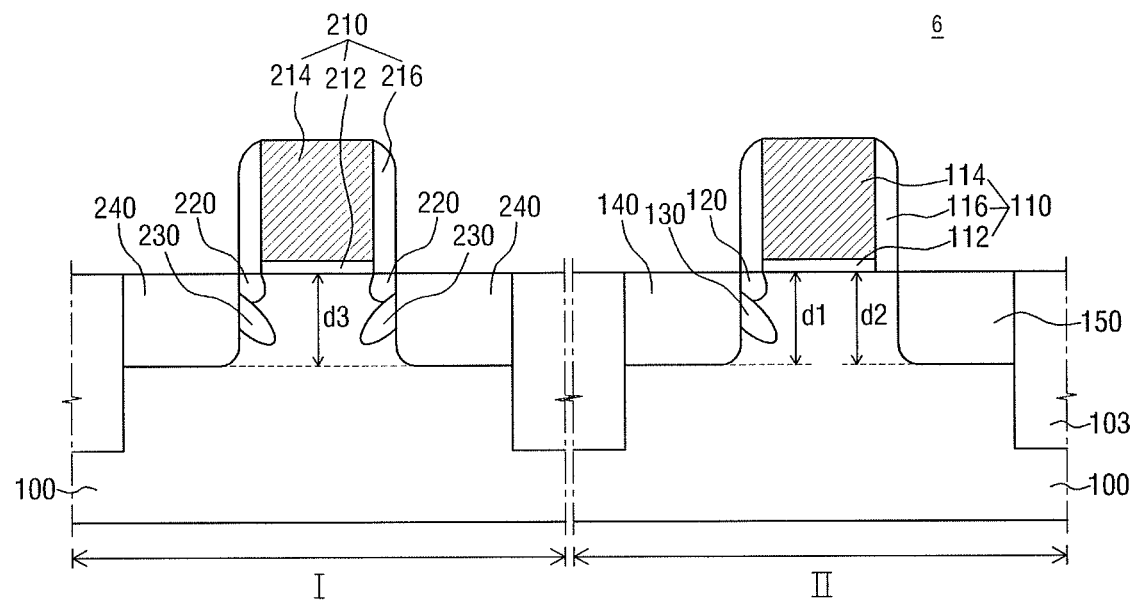
FIG. 7 illustrates a view of a semiconductor device according to a sixth embodiment.

FIG. 7 is a view illustrating a semiconductor device according to a sixth embodiment.

Referring to FIG. 7, the semiconductor device 6 according to the sixth embodiment includes a first gate structure 110, a second gate structure 210, a first source/drain extension 120, a second source/drain extension 220, a first halo region 130, a second halo region 230, a first source/drain region 140, a second source/drain region 150, and a third source/drain region 240.

The substrate 100 may include a first region (I) and a second region (II). The first region I and the second region II may be regions separated from each other or connected to each other.

The first gate structure 110 is formed on the second region II of the substrate 100. The first gate structure 110 includes a first gate insulation film 112, a first gate electrode 114 and a first gate spacer 116.

The second gate structure 210 is formed on the first region I of the substrate 100. The second gate structure 210 includes a second gate insulation film 212, a second gate electrode 214 and a second gate spacer 216.

The second gate insulation film 212 may include, for example, silicon oxide, SiON, $Ge_xO_yN_z$, $Ge_xSi_yO_z$, a high-k film, a combination thereof, and a stacked film having these materials sequentially stacked one on another. The second gate electrode 214 may include, for example, one of poly silicon (poly Si), amorphous silicon (a-Si), titanium (Ti), titanium nitride (TiN), tantalum nitride (TaN), aluminum (Al), and combinations thereof. The second gate spacer 216 may include, for example, silicon nitride, silicon oxynitride, silicon oxide, silicon carbon nitride (SiOCN).

In the semiconductor device according to the sixth embodiment, a thickness of the first gate spacer 116 formed at both surfaces of the first gate electrode 114 and a thickness of the second gate spacer 216 formed at both surfaces of the second gate electrode 214 are substantially equal to each other.

For example, the first gate spacer 116 formed at both surfaces of the first gate electrode 114 and the second gate spacer 216 formed at both surfaces of the second gate electrode 214 may be formed by the same fabrication process.

The first source/drain extension 120 is formed at one side of the first gate structure 110 but is not formed at the other side of the first gate structure 110. The first source/drain extension 120 is asymmetrically formed around the first gate structure 110 in the substrate 100. The first source/drain extension 120 includes a doped first type impurity.

The second source/drain extension 220 is formed at both sides of the second gate structure 210. That is to say, the second source/drain extension 220 is symmetrically formed around the second gate structure 210 in the substrate 100. The second source/drain extension 220 includes a doped first type impurity.

In the semiconductor device according to the sixth embodiment, an overlapping width between the first source/drain extension 120 and the first gate structure 110 may be substantially equal to that between the second source/drain extension 220 and the second gate structure 210. Since the first source/drain extension 120 and the second source/drain extension 220 are formed at the same level, the overlapping width between the first source/drain extension 120 and the first gate structure 110 may be equal to that between the second source/drain extension 220 and the second gate structure 210. Here, the expression "being formed at the same level" is used to mean being formed by the same fabrication process.

In addition, a concentration of the first type impurity doped into the first source/drain extension 120 and a concentration of the first type impurity doped into the second source/drain extension 220 is substantially equal to each other.

The first halo region 130 is formed at one side of the first gate structure 110 with the first source/drain extension 120 formed thereat while not being formed at the other side of the first gate structure 110. The first halo region 130 is asymmetrically formed around the first gate structure 110 in the substrate 100. The first halo region 130 includes a second type impurity different from the first type impurity doped into the first source/drain extension 120.

The second halo region 230 is formed at both sides of the second gate structure 210. That is to say, the second halo region 230 is symmetrically formed around the second gate structure 210 in the substrate 100. The second halo region 230 includes a doped second type impurity.

A concentration of the second type impurity doped into the first halo region 130 is substantially equal to that of the second type impurity doped into the second halo region 230.

The first source/drain region 140 is formed at one side of the first gate structure 110 with the first source/drain extension 120 and the first halo region 130 formed thereat.

The second source/drain region 150 is formed at the other side of the first gate structure 110 without the first source/drain extension 120 and the first halo region 130 formed thereat.

The first source/drain region 140 and the second source/drain region 150 include a doped first type impurity.

The third source/drain region 240 is formed at both sides of the second gate structure 210. That is to say, the third source/drain region 240 is symmetrically formed around the second gate structure 210 in the substrate 100. The third source/drain region 240 includes a doped first type impurity.

In FIG. 7, the first source/drain extension 120, the first halo region 130 and the first source/drain region 140 are formed at one side of the first gate structure 110 in the substrate 100. However, only the source/drain region 150 is formed at the other side of the first gate structure 110 without the source/drain extension 120 and the first halo region 130 formed thereat. That is to say, the transistor formed in the second region II of the substrate 100 may be an asymmetrical transistor.

However, the second source/drain extension 220, the second halo region 230 and the third source/drain region 240 are formed at both sides of the second gate structure 210 in the substrate 100. That is to say, the transistor formed in the first region I of the substrate 100 may be a symmetrical transistor.

As a result, the semiconductor device 6 according to the sixth embodiment of may include both an asymmetrical transistor and a symmetrical transistor.

In FIG. 7, a depth of the first source/drain region 140, that is, a depth ranging from the top surface of the substrate 100 to the lowermost surface of the first source/drain region 140, is a first depth d1. In addition, a depth of the second source/drain region 150 is a second depth d2, and a depth of the third source/drain region 240 is a third depth d3.

In the semiconductor device 6 according to the sixth embodiment, the depth d1 of the first source/drain region 140, the depth d2 of the second source/drain region 150, and the depth d3 of the third source/drain region 240 are substantially equal to one another.

In addition, the first source/drain extension 120, the first source/drain region 140, the second source/drain region 150 and the third source/drain region 240 include a doped first type impurity. A concentration of the first type impurity doped into the first source/drain region 140 is a first concentration, a concentration of the first type impurity doped into the second source/drain region 150 is a second concentration, a concentration of the first type impurity doped into the first source/drain extension 120 is a third concentration, and a concentration of the first type impurity of the third source/drain region 240 is a fourth concentration. The first concentration, the second concentration and the fourth concentration are greater than the third concentration.

In the semiconductor device according to the sixth embodiment, the first concentration of the first type impurity doped into the first source/drain region 140, the second concentration of the first type impurity doped into the second source/drain region 150, and the fourth concentration of the first type impurity doped into the third source/drain region 240 are substantially equal to one another.

As described above, the depth d1 of the first source/drain region 140, the depth d2 of the second source/drain region 150 and the depth d3 of the third source/drain region 240 are substantially equal to one another. In addition, the first concentration of the first type impurity doped into the first source/drain region 140, the second concentration of the first type impurity doped into the second source/drain region 150, and the fourth concentration of the first type impurity doped into the third source/drain region 240 are substantially equal to one another.

That is to say, the transistor formed in the second region II of the substrate 100 is an asymmetrical transistor. However, the first source/drain region 140 and the second source/drain region 150 formed at both sides of the first gate structure 110 are symmetrically formed in the substrate 100.

A semiconductor device according to a seventh embodiment will be described with reference to FIG. 8. For convenience of explanation, the following description will focus on differences between the first and seventh embodiments.

Figure 8:
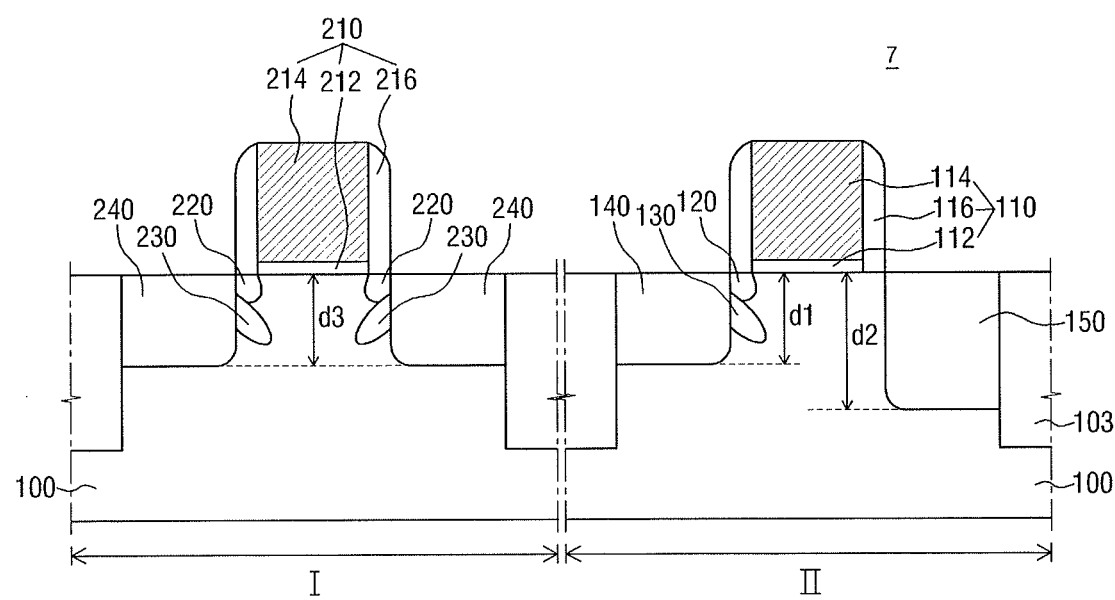
FIG. 8 illustrates a view of a semiconductor device according to a seventh embodiment.

FIG. 8 is a view illustrating a semiconductor device according to the seventh embodiment.

Referring to FIG. 8, a depth of the first source/drain region 140, that is, a depth ranging from the top surface of the substrate 100 to the lowermost surface of the first source/drain region 140, is a first depth d1. In addition, a depth of the second source/drain region 150 is a second depth d2, and a depth of the third source/drain region 240 is a third depth d3.

In the semiconductor device according to the seventh embodiment, the depth d2 of the second source/drain region 150 is greater than the depth d1 of the first source/drain region 140. In addition, the depth d1 of the first source/drain region 140 and the depth d3 of the third source/drain region 240 are substantially equal to each other.

In detail, the first source/drain region 140 formed at one side of the first gate structure 110 with the first halo region 130 and the first source/drain extension 120 formed thereat is formed to be shallower than the second source/drain region 150 formed at the other side of the first gate structure 110 without the first halo region 130 and the first source/drain extension 120 formed thereat.

However, the first source/drain region 140 formed at one side of the first gate structure 110 with the first halo region 130 and the first source/drain extension 120 formed thereat, and the third source/drain region 240 formed at both sides of the second gate structure 210 with the second halo region 230 and the second source/drain extension 220 formed thereat, are formed to have the same depth. That is to say, source/drain regions formed at portions of the substrate 100 with a halo region and a source/drain extension formed thereat are formed to have the same depth.

A concentration of the first type impurity doped into the first source/drain region 140 is a first concentration, a concentration of the first type impurity doped into the second source/drain region 150 is a second concentration, a concentration of the first type impurity doped into the first source/drain extension 120 is a third concentration, and a concentration of the first type impurity doped into the third source/drain region 240 is a fourth concentration.

The first concentration is substantially equal to the fourth concentration, and the first concentration is different with the second concentration and the third concentration. In detail, the third concentration of the first type impurity doped into the first source/drain extension 120 is smaller than the first concentration of the first type impurity doped into the first source/drain region 140 and the second concentration of the first type impurity doped into the second source/drain region 150.

In the semiconductor device according to the seventh embodiment, the first concentration of the first type impurity doped into the first source/drain region 140 and the fourth concentration of the first type impurity doped into the third source/drain region 240 are greater than the second concentration of the first type impurity doped into the second source/drain region 150.

A method for fabricating the semiconductor device according to the sixth embodiment will be described with reference to FIGS. 7 and 12 to 14.

Figure 12:
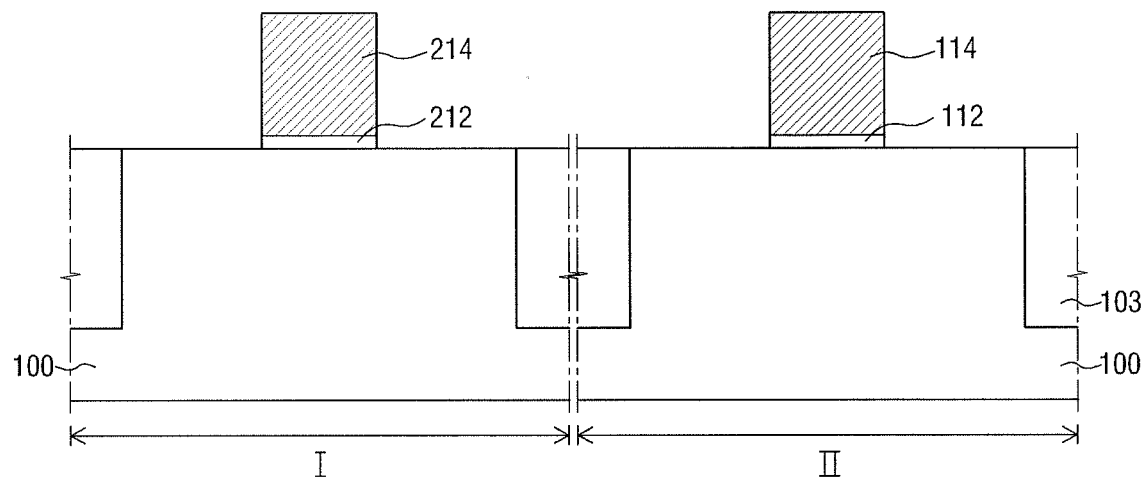
FIGS. 12 to 14 illustrate intermediate process steps in a method for fabricating the semiconductor device according to the sixth embodiment.
Figure 13:
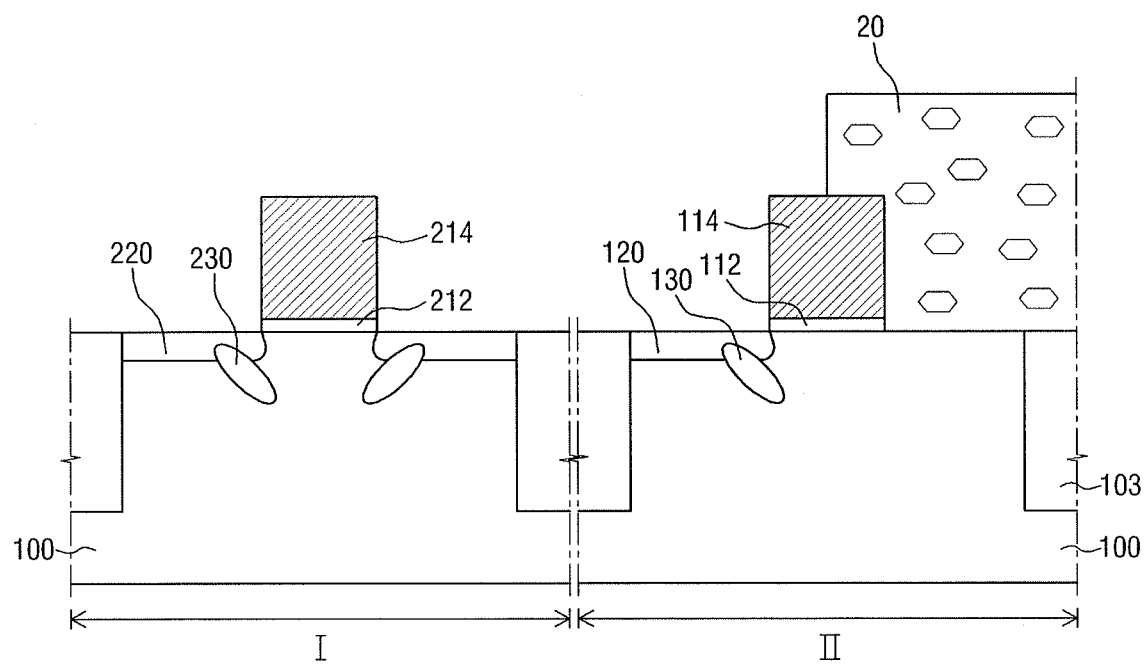
Figure 14:
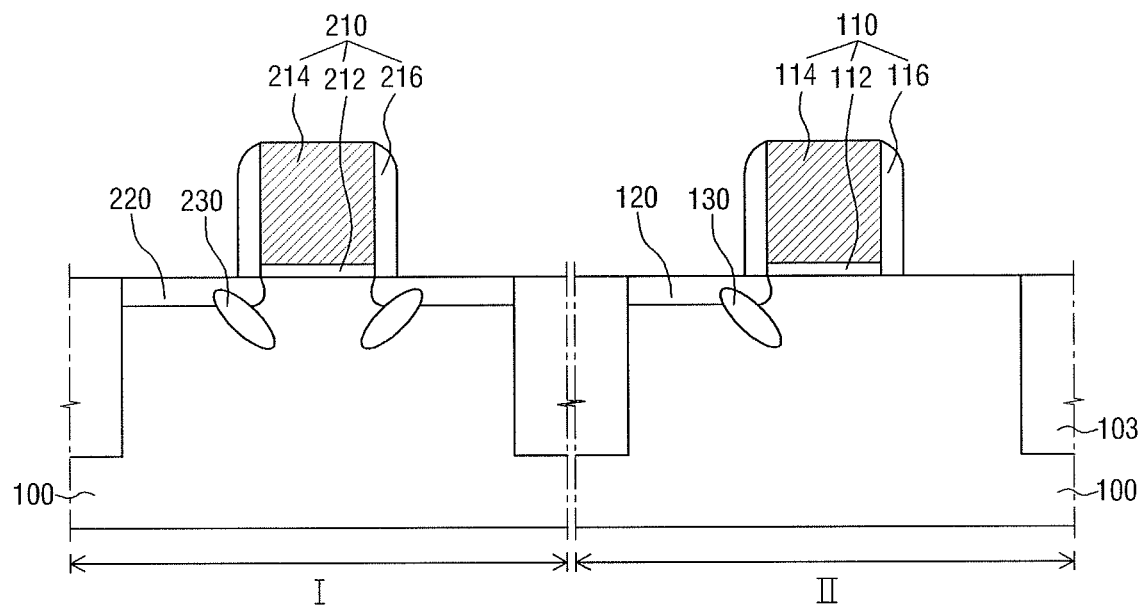

FIGS. 12 to 14 illustrate intermediate process steps in a method for fabricating the semiconductor device according to the sixth embodiment.

Referring to FIG. 12, the first gate insulation film 112 and the first gate electrode 114 are formed on the second region II of the substrate 100. The second gate insulation film 212 and the second gate electrode 214 are formed on the first region I of the substrate 100.

The first gate electrode 114 is formed on the first gate insulation film 112, and the second gate electrode 214 is formed on the second gate insulation film 212.

The first gate insulation film 112 and the second gate insulation film 212 may be formed using, for example, annealing, treatment with a chemical material, atomic layer deposition (ALD), or chemical vapor deposition (CVD), but not limited thereto.

The first gate electrode 114 and the second gate electrode 214 may be formed using, for example, sputtering, physical vapor deposition, or plasma deposition, but not limited thereto.

Referring to FIG. 13, a first mask pattern 20 is formed on the second region II of the substrate 100, the first mask pattern 20 covering a portion of the first gate electrode 114 and the substrate 100 of the other side of the first gate electrode 114.

In detail, the first mask pattern 20 is not formed on the first region I of the substrate 100, so that it does not cover the second gate electrode 214. In addition, since the first mask pattern 20 is formed on a portion of the second region II of the substrate 100, that is, on a portion of the first gate electrode 114 and the substrate 100 of the other side of the first gate electrode 114, but is not formed on the remaining portion of the first gate electrode 114 and the substrate 100 of one side of the first gate electrode 114.

The first mask pattern 20 may be, for example, a photoresist pattern, but not limited thereto.

Next, the first source/drain extension 120 is formed at one side of the first gate electrode 114 in the substrate 100 using the first mask pattern 20 as a mask. Since the other side of the first gate electrode 114 is covered by the first mask pattern 20, a source/drain extension 120 is not formed at the other side of the first gate electrode 114.

In addition, the second source/drain extension 220 is formed at both sides of the second gate electrode 214 in the substrate 100 using the first mask pattern 20 as a mask.

For example, the first source/drain extension 120 and the second source/drain extension 220 may be formed at the same time by the same fabrication process, but aspects of embodiments are not limited thereto.

The first source/drain extension 120 and the second source/drain extension 220 may be formed by, for example, an ion implantation process.

Next, the first halo region 130 is formed at one side of the first gate electrode 114 in the substrate 100 using the first mask pattern 20 as a mask. The first halo region 130 is not formed at the other side of the first gate electrode 114 covered by the first mask pattern 20.

In addition, the second halo region 230 is formed at both sides of the second gate electrode 214 in the substrate 100 using the first mask pattern 20 as a mask.

For example, the first halo region 130 and the second halo region 230 may be formed by the same fabrication process.

The first halo region 130 and the second halo region 230 may be formed by, for example, a tilted ion implantation process.

Next, the first mask pattern 20 covering the portion of the first gate electrode 114 and the substrate 100 of the other side of the first gate electrode 114 is removed.

Referring to FIG. 14, the first gate spacer 116 and the second gate spacer 216 are formed on side surfaces of the first gate electrode 114 and side surfaces of the second gate electrode 214, respectively.

In detail, a spacer layer is formed, the spacer layer conformally covering the top surface of the substrate 100, the first gate electrode 114 and the second gate electrode 214. The spacer layer may include, for example, silicon nitride, silicon oxynitride, silicon oxide, silicon carbon nitride (SiOCN). The spacer layer may be formed by, for example, chemical vapor deposition.

Next, the spacer layer is anisotropically etched, thereby forming the first gate spacer 116 and the second gate spacer 216 on the side surfaces of the first gate electrode 114 and the side surfaces of the second gate electrode 214, respectively.

As a result, the first gate structure 110 is formed on the second region II of the substrate 100, and the second gate structure 210 is formed on the first region I of the substrate 100.

Referring to FIG. 7, the first source/drain region 140 is formed at one side of the first gate structure 110, the second source/drain region 150 is formed at the other side of the first gate structure 110, and the third source/drain region 240 is formed at both sides of the second gate structure 210 using the first gate structure 110 and the second gate structure 210 as masks.

In the method for fabricating the semiconductor device according to an embodiment, the first to third source/drain regions 140, 150 and 240 may be formed at the same time.

Therefore, the depth d1 of the first source/drain region 140, the depth d2 of the second source/drain region 150 and the depth d3 of the third source/drain region 240 are substantially equal to each other. The first concentration of the first type impurity doped into the first source/drain region 140, the second concentration of the first type impurity doped into the second source/drain region 150, and the fourth concentration of the first type impurity doped into the third source/drain region 240 are substantially equal to one another.

A method for fabricating the semiconductor device according to the seventh embodiment will now be described with reference to FIGS. 8 and 12 to 16.

Figure 15:
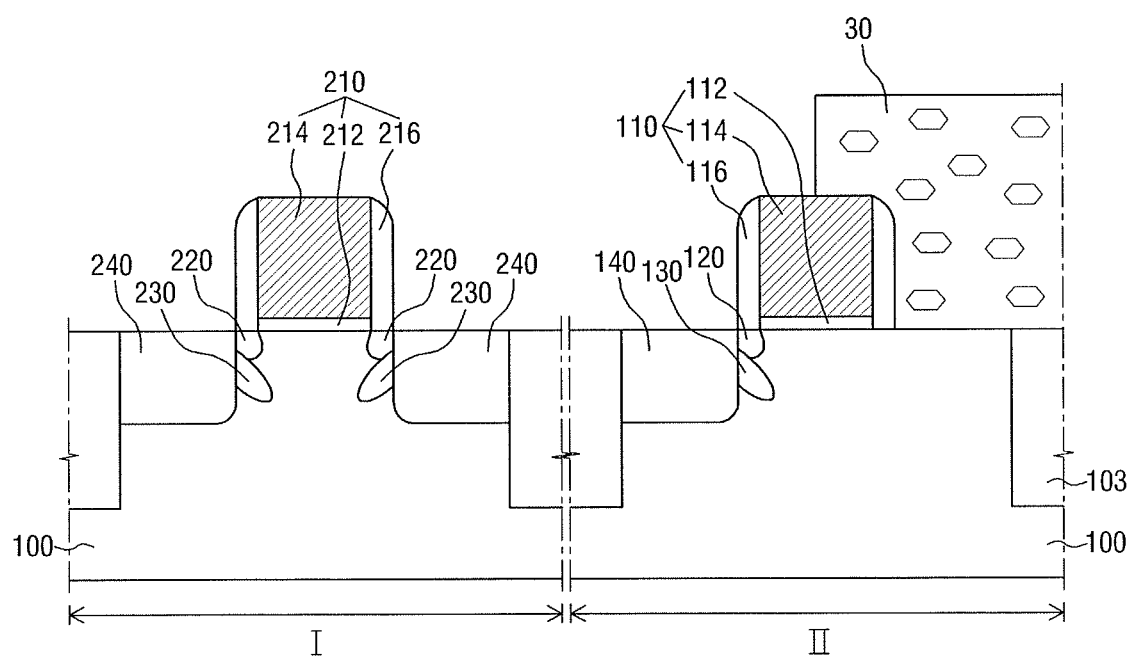
FIGS. 15 and 16 illustrate intermediate process steps in a method for fabricating the semiconductor device according to the seventh embodiment.
Figure 16:
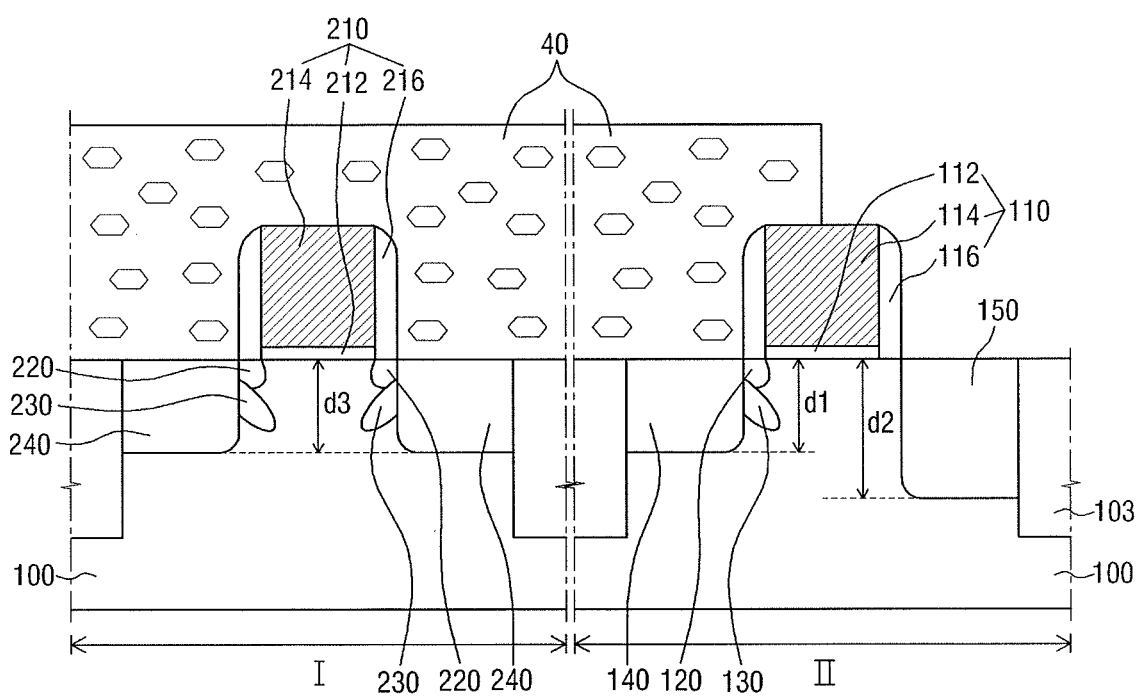

FIGS. 15 and 16 illustrate intermediate process steps in a method for fabricating the semiconductor device according to the seventh embodiment.

Referring to FIG. 15, after forming the first gate spacer 116 and the second gate spacer 216, a second mask pattern 30 is formed on the second region II of the substrate 100, the second mask pattern 30 covering a portion of the first gate electrode 114 and the substrate 100 of the other side of the first gate electrode 114.

In detail, the second mask pattern 30 is not formed on the first region I of the substrate 100, so that it does not cover the second gate structure 210. In addition, since the second mask pattern 30 is formed on a portion of the second region II of the substrate 100, that is, a portion of the first gate structure 110, and the substrate 100 of the other side of the first gate structure 110, the second mask pattern 30 is not formed on the remaining portion of the first gate structure 110 and the substrate 100 of one side of the first gate structure 110.

The second mask pattern 30 may be, for example, a photoresist pattern, but not limited thereto.

Next, the first source/drain region 140 is formed at one side of the first gate structure 110 in the substrate 100 using the second mask pattern 30 as a mask. Since the other side of the first gate structure 110 is covered by the second mask pattern 30, the first source/drain region 140 is not formed at the other side of the first gate structure 110.

In addition, the third source/drain region 240 is formed at both sides of the second gate structure 210 in the substrate 100 using the second mask pattern 30 as a mask.

For example, the first source/drain region 140 and the third source/drain region 240 may be formed by the same fabrication process.

The first source/drain region 140 and the third source/drain region 240 may be formed by, for example, an ion implantation process.

Next, the second mask pattern 30 covering the portion of the first gate structure 110 and the substrate 100 of the other side of the first gate structure 110 is removed.

Referring to FIG. 16, a third mask pattern 40 is formed, the third mask pattern 40 covering the first source/drain region 140 and the third source/drain region 240.

In detail, the third mask pattern 40 entirely covers the first region I of the substrate 100 and a portion of the second region II of the substrate 100, that is, one side of the first gate structure 110 with the first source/drain region 140 formed thereat. That is to say, through the process shown in FIG. 15, the third mask pattern 40 is not formed on the substrate 100 of the other side of the first gate structure 110 without the first source/drain region 140 formed thereat.

The third mask pattern 40 may be, for example, a photoresist pattern, but not limited thereto.

Next, the second source/drain region 150 is formed at the other side of the first gate structure 110 in the substrate 100 using the third mask pattern 40 as a mask.

The second source/drain region 150 may be formed by, for example, an ion implantation process. However, in the ion implantation process for forming the second source/drain region 150, an amount of the first type impurity doped into the second source/drain region 150 may be smaller than that of the first type impurity doped into the first source/drain region 140. Conversely, implantation energy for implanting the first type impurity into the second source/drain region 150 may be greater than that for implanting the first type impurity into the first source/drain region 140.

In the method for fabricating the semiconductor device according to the embodiment, the first and third source/drain regions 140 and 240 are formed at the same time but are formed using different fabrication processes.

Therefore, the depth d2 of the second source/drain region 150 is greater than the depth d1 of the first source/drain region 140. In addition, the depth d1 of the first source/drain region 140 and the depth d3 of the third source/drain region 240 are substantially equal to each other. In addition, the first concentration of the first type impurity doped into the first source/drain region 140 and the fourth concentration of the first type impurity first type impurity first type impurity doped into the third source/drain region 240 are greater than the second concentration of the first type impurity doped into the second source/drain region 150.

Next, the third mask pattern 40 is removed.

Figure 9:
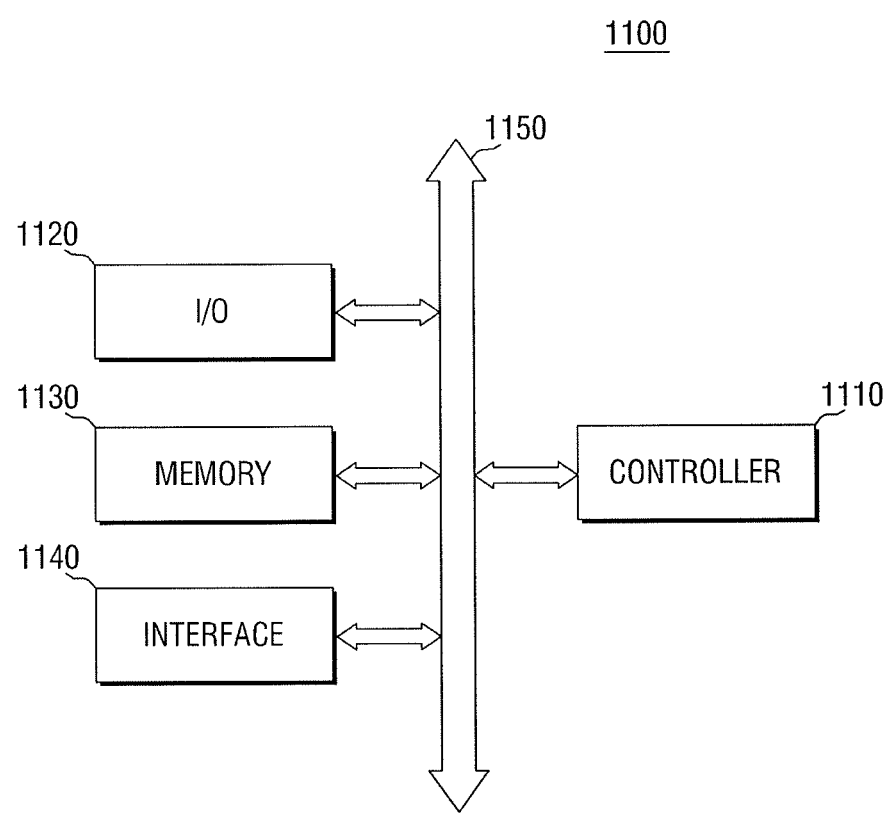
FIG. 9 illustrates a block diagram of an electronic system including semiconductor devices according to some embodiments.

FIG. 9 is a block diagram of an electronic system including semiconductor devices according to some embodiments.

Referring to FIG. 9, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The semiconductor device according to some embodiments may be used in at least one of the logic blocks.

The controller 1110 may include at least one of a microprocessor, a digital signal processor, a microcontroller, and logic elements capable of functions similar to those of these elements. The I/O 1120 may include a keypad, a keyboard, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include high-speed DRAM and/or SRAM as a working memory for improving the operation of the controller 1110. Fin electric field effect transistors according to some embodiments may be provided in the memory device 1130 or may be provided as some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 10:
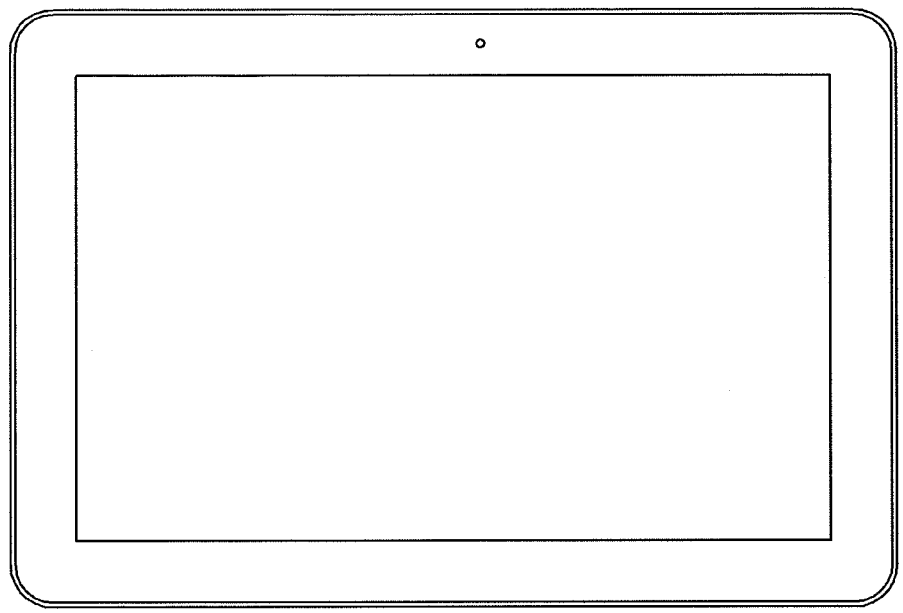
FIGS. 10 and 11 illustrate exemplary semiconductor systems to which semiconductor devices according to some embodiments can be applied.
Figure 11:
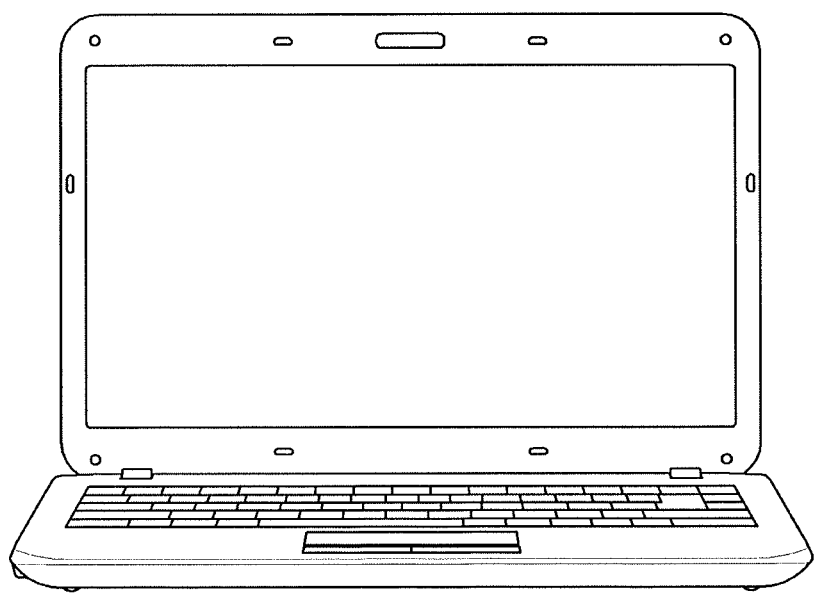

FIGS. 10 and 11 illustrate exemplary semiconductor systems to which semiconductor devices according to some embodiments can be applied. FIG. 10 illustrates an example in which a semiconductor device according to an embodiment is applied to a tablet PC, and FIG. 11 illustrates an example in which a semiconductor device according to an embodiment is applied to a notebook computer. At least one of the semiconductor devices according to some embodiments can be employed to a tablet PC, a notebook computer, and the like. It is obvious to one skilled in the art that the semiconductor devices according to some embodiments may also be applied to other IC devices not illustrated herein.

While exemplary embodiments have been particularly shown and described, it will be understood by those of ordinary skill in the art that various changes in form and details may be made therein without departing from exemplary implementations as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device, comprising:
    a gate structure on a substrate;
    a source/drain extension at a first side of the gate structure and doped with a first type impurity;
    a halo region at the first side of the gate structure and doped with a second type impurity different from the first type impurity;
    a first source/drain region at the first side of the gate structure and doped with the first type impurity;
    a second source/drain region formed at a second side of the gate structure and doped with the first type impurity; and
    a first recess and a second recess at the first side and the second side of the gate structure in the substrate, the first source/drain region and the second source/drain region being in the first recess and the second recess, respectively,
    wherein the source/drain extension and the halo region are only at one side of the gate structure.

2. The semiconductor device as claimed in claim 1, wherein a concentration of the first type impurity in the first source/drain region is a first concentration, a concentration of the first type impurity in the second source/drain region is a second concentration, a concentration of the first type impurity in the source/drain extension is a third concentration, the first concentration and the second concentration are substantially equal to each other, and the third concentration is smaller than the first concentration.

3. The semiconductor device as claimed in claim 2, wherein a depth from a top surface of the substrate to a lowermost surface of the first source/drain region and a depth from the top surface of the substrate to a lowermost surface of the second source/drain region are substantially equal to each other.

4. The semiconductor device as claimed in claim 1, wherein a concentration of the first type impurity in the first source/drain region is a first concentration, a concentration of the first type impurity in the second source/drain region is a second concentration, a concentration of the first type impurity in the source/drain extension is a third concentration, and the first concentration, the second concentration, and the third concentration are different from one another.

5. The semiconductor device as claimed in claim 4, wherein the first concentration is greater than the second concentration, and the second concentration is greater than the third concentration.

6. The semiconductor device as claimed in claim 4, wherein a depth from a top surface of the substrate to a lowermost surface of the second source/drain region is greater than a depth from the top surface of the substrate to a lowermost surface of the first source/drain region.

7. A semiconductor device, comprising:
a gate structure on a substrate;
a source/drain extension at a first side of the gate structure and doped with a first type impurity;
a halo region at the first side of the gate structure and doped with a second type impurity different from the first type impurity;
a first source/drain region at the first side of the gate structure and doped with the first type impurity;
a second source/drain region formed at a second side of the gate structure and doped with the first type impurity; and
an interlayer dielectric film on the substrate, the interlayer dielectric film including a trench, wherein the gate structure includes a gate insulation film and a gate electrode, and the gate insulation film extends along side surfaces and a bottom surface of the trench,
wherein the source/drain extension and the halo region are only at one side of the gate structure.

8. A semiconductor device, comprising:
a first gate structure and a second gate structure on a substrate;
a first source/drain extension at a first side of the gate structure, while not being formed at a second side of the gate structure, and doped with a first type impurity;
a first halo region at one the first side of the first gate structure, while not being formed at the second side of the first gate structure, and doped with a second type impurity different from the first type impurity;
a first source/drain region at the first side of the first gate structure and doped with the first type impurity;
a second source/drain region at second side of the first gate structure and doped with the first type impurity;
a second source/drain extension at first and second sides of the second gate structure and doped with the first type impurity;
a second halo region at the first and second sides of the second gate structure and doped with the second type impurity; and
a third source/drain region at the first and second sides of the second gate structure and doped with the first type impurity.

9. The semiconductor device as claimed in claim 8, wherein a concentration of the first type impurity in the first source/drain region is a first concentration, a concentration of the first type impurity in the second source/drain region is a second concentration, a concentration of the first type impurity in the third source/drain region is a third concentration, and the first concentration, the second concentration, and the third concentration are substantially equal to each other.

10. The semiconductor device as claimed in claim 9, wherein a depth from a top surface of the substrate to a lowermost surface of the first source/drain region, a depth from the top surface of the substrate to a lowermost surface of the second source/drain region, and a depth from the top surface of the substrate to a lowermost surface of the third source/drain region, are substantially equal to each other.

11. The semiconductor device as claimed in claim 8, wherein a concentration of the first type impurity in the first source/drain region is a first concentration, a concentration of the first type impurity in the second source/drain region is a second concentration, a concentration of the first type impurity in the third source/drain region is a third concentration, the first concentration and the third concentration are substantially equal to each other, and the first concentration is different from the second concentration.

12. The semiconductor device as claimed in claim 11, wherein the first concentration is greater than the second concentration.

13. The semiconductor device as claimed in claim 11, wherein a depth from a top surface of the substrate to a lowermost surface of the first source/drain region is substantially equal to a depth from the top surface of the substrate to a lowermost surface of the third source/drain region, and a depth from the top surface of the substrate to a lowermost surface of the second source/drain region is greater than the depth ranging from the top surface of the substrate to the lowermost surface of the first source/drain region.

14. The semiconductor device as claimed in claim 8, wherein an overlapping width between the first source/drain extension and the first gate structure is substantially equal to that between the second source/drain extension and the second gate structure.

15. A semiconductor device, comprising:
a substrate including a first region and second region;
a symmetrical transistor in the first region, the symmetrical transistor including a first gate structure, a first source/drain extension, and a first halo region, wherein the first source/drain extension and the first halo region are at first and second sides of the first gate structure; and
an asymmetrical transistor in the second region, the asymmetrical transistor including a second gate structure, a second source/drain extension, and a second halo region, wherein the second source/drain extension and the second halo region are only at one side of the second gate structure.

16. The semiconductor device as claimed in claim 15, wherein the first source/drain extension and the second source/drain extension are at a same level, the first halo region and the second halo region being at a same level.

17. The semiconductor device as claimed in claim 15, wherein:
the symmetrical transistor includes a first source/drain region at first and second sides of the first gate structure, and
the asymmetrical transistor includes a second source/drain region at a first side of the second gate structure, and a third source/drain region at a second side of the second gate structure.

18. The semiconductor device as claimed in claim 17, wherein the first source/drain region, the second source/drain region, and the third source/drain region are at a same level.

19. The semiconductor device as claimed in claim 15, wherein:
the second gate structure includes a gate electrode and a gate spacer at first and second sidewalls of the gate electrode, and
a first thickness of the gate spacer on the first sidewall of the gate electrode is equal to a second thickness of the gate spacer on the second sidewall of the gate electrode.

* * * * *